US012771100B2

(12) United States Patent
Pei

(10) Patent No.: US 12,771,100 B2
(45) Date of Patent: Oct. 20, 2026

(54) OUTDOOR CABINET

(71) Applicant: Sungrow Energy Storage Technology Co., Ltd., Hefei (CN)

(72) Inventor: Yilin Pei, Hefei (CN)

(73) Assignee: Sungrow Energy Storage Technology Co., Ltd., Hefei (CN)

( * ) Notice: Subject to any disclaimer, the term of this patent is extended or adjusted under 35 U.S.C. 154(b) by 130 days.

(21) Appl. No.: 18/533,744

(22) Filed: Dec. 8, 2023

(65) Prior Publication Data

US 2024/0268553 A1 Aug. 15, 2024

(30) Foreign Application Priority Data

Feb. 15, 2023 (CN) ........................ 202320279009.5

(51) Int. Cl.

| | |
|---|---|
| ***H02B 1/28*** | (2006.01) |
| ***H02B 1/00*** | (2006.01) |
| ***H02B 1/30*** | (2006.01) |
| ***H05K 5/06*** | (2006.01) |
| *A47B 81/00* | (2006.01) |
| *H02B 1/38* | (2006.01) |
| *H05K 5/02* | (2006.01) |

(52) U.S. Cl.

CPC ................. *H02B 1/28* (2013.01); *H02B 1/30* (2013.01); *A47B 81/00* (2013.01); *E05Y 2900/208* (2013.01); *H02B 1/38* (2013.01); *H05K 5/0217* (2013.01); *H05K 5/061* (2013.01)

(58) Field of Classification Search

CPC . H02B 1/28; H02B 1/30; A47B 81/00; H05K 5/0217; H05K 5/061

See application file for complete search history.

(56) References Cited

U.S. PATENT DOCUMENTS 4,123,071 A * 10/1978 Yamamoto ................ E06B 3/62 277/921
4,665,654 A * 5/1987 Stedron .................... H02B 1/28 49/401
6,102,498 A * 8/2000 Kohler ..................... H02B 1/28 312/223.1

(Continued)

FOREIGN PATENT DOCUMENTS

CN 218644158 U * 3/2023
DE 20 2007 005423 U1 8/2008
EP 0 961 377 A1 12/1999

OTHER PUBLICATIONS

Extended European Search Report for European Application No. 23211564.2, dated Apr. 25, 2024.

*Primary Examiner* — Kimberley S Wright
(74) *Attorney, Agent, or Firm* — Wolf, Greenfield & Sacks, P.C.

(57) ABSTRACT

An outdoor cabinet is provided. The outdoor cabinet includes a cabinet body, a cabinet door, a flange structure and a sealing structure. The cabinet door is connected to the cabinet body. The flange structure is arranged on the cabinet body. The sealing structure includes a groove, and the flange structure is clamped in the groove. A flange drainage gap is formed at the flange structure, and an auxiliary drainage gap is formed at the sealing structure. The flange drainage gap and the auxiliary drainage gap are arranged in correspondence. Water entering the groove can be discharged after passing through the flange drainage gap and the auxiliary drainage gap.

16 Claims, 5 Drawing Sheets

(56) References Cited

U.S. PATENT DOCUMENTS

| | | | | |
|---|---|---|---|---|
| 6,428,127 | B1 * | 8/2002 | Rasmussen | A47B 47/03 312/265.4 |
| 10,779,422 | B2 | 9/2020 | Wilson et al. | |
| 11,622,460 | B2 * | 4/2023 | Thrailkill | H05K 5/062 174/50 |
| 12,222,036 | B2 * | 2/2025 | Anderson | H02B 1/28 |
| 2005/0174020 | A1 * | 8/2005 | Francisquini | H02B 1/01 312/265.3 |
| 2011/0181161 | A1 * | 7/2011 | Hsiao | H05K 7/18 312/352 |
| 2015/0075080 | A1 * | 3/2015 | Ellingson | H02B 1/28 49/489.1 |
| 2016/0073547 | A1 * | 3/2016 | Maloney | H05K 7/183 211/26 |
| 2016/0234953 | A1 * | 8/2016 | Ellingson | H05K 5/061 |
| 2019/0090369 | A1 * | 3/2019 | Wilson | H05K 5/0217 |

* cited by examiner

OUTDOOR CABINET

CROSS REFERENCE TO RELATED APPLICATIONS

This application claims the priority to Chinese Patent Application No. 202320279009.5 titled "outdoor cabinet", filed with the China National Intellectual Property Administration on Feb. 15, 2023, which is incorporated herein by reference in its entirety.

FIELD

The present application relates to the technical field of outdoor cabinets, and in particular to an outdoor cabinet.

BACKGROUND

With the improvement of people's living standards, the requirements for outdoor cabinets also increase. Since outdoor cabinets are in an outdoor environment where rainfall, snowfall, and strong winds may occur at any time, the requirements of waterproof performance and corrosion resistance of outdoor cabinets are high. A sealing and waterproof structure of the conventional outdoor cabinet generally employs a self-clamping sealing strip, the sealing strip is clamped into a flange of a door frame, and after the door is closed and a door lock is clamped well, the sealing strip is compressed to seal the outdoor cabinet.

However, when the above structure is used to seal the outdoor cabinet, the requirements for machining technology are high. Specifically, the flange needs to be carefully polished during machining and manufacturing to ensure the roughness of the flange. However, the space at the inner side of the flange is limited, leading to difficulty in polishing. If the flange is not polished well, the sealing strip may not be tightly clamped in the flange, resulting in water backflow and water leakage from the inside of the sealing strip. In addition, a transition arc weldment that connects a vertical flange and a horizontal flange may be deformed by a force after being welding, so it is necessary to strictly control the welding process to ensure flatness and surface roughness of the weldment at the arc corners after welding; otherwise, a gap may exist between the flange and the sealing strip after the sealing strip is clamped, which leads to water leakage. Therefore, in order to meet the machining requirements, a large amount of manpower and material resources are required to handle the machining process, which greatly increases the processing and manufacturing costs.

SUMMARY

The main purpose of the present application is to provide an outdoor cabinet to solve the problem that when a conventional waterproof structure is used for sealing the outdoor cabinet, a large amount of manpower and material resources are required to handle the machining process in order to meet the machining requirements, which results in high processing and manufacturing costs.

In order to achieve the above purpose, an outdoor cabinet is provided according to one aspect of the present application. The outdoor cabinet includes a cabinet body, a cabinet door being connected to the cabinet body, a flange structure being arranged on the cabinet body, and a sealing structure, where the sealing structure includes a groove, and the flange structure is clamped in the groove; a flange drainage gap is provided at the flange structure, and an auxiliary drainage gap is provided at the sealing structure, the flange drainage gap and the auxiliary drainage gap are arranged in positional correspondence with each other, and flange drainage gap and the auxiliary drainage gap are configured to discharge water entering the groove.

In an embodiment, the sealing structure further includes a groove, the groove includes a first side plate, a bottom plate, and a second side plate connected in sequence. The auxiliary drainage gap is provided at the first side plate, and the second side plate abuts against the flange structure for sealing.

In an embodiment, the number of flange drainage gaps is at least two, the at least two flange drainage gaps are provided at a bottom of the flange structure, where at least one of the flange drainage gaps is located at a first side of the flange structure, and at least another one of the flange drainage gaps is located at a second side of the flange structure.

In an embodiment, the flange drainage gap includes a first drainage gap and a second drainage gap, and the auxiliary drainage gap includes a third drainage gap and a fourth drainage gap. The first drainage gap and the third drainage gap are arranged in positional correspondence with each other, the second drainage gap and the fourth drainage gap are arranged in positional correspondence with each other, and the first drainage gap is located above the second drainage gap.

In an embodiment, the flange structure includes a transition arc structure, a vertical flange, and a horizontal flange. The vertical flange is connected to the horizontal flange through the transition arc structure, the first drainage gap is formed at the vertical flange, and the second drainage gap is formed at the horizontal flange.

In an embodiment, the third drainage gap is formed at the first side plate or the second side plate, and the fourth drainage gap is formed at the first side plate or the second side plate.

In an embodiment, the first drainage gap is located at a first end of the transition arc structure, and the second drainage gap is located at a second end of the transition arc structure.

In an embodiment, the groove includes an arc section, the arc section is located at a bottom of the sealing structure, and the arc section is configured to match the transition arc structure.

In an embodiment, an area of the auxiliary drainage gap is greater than an area of the flange drainage gap.

In an embodiment, the groove is a U-shaped groove, and a distance between the first side plate and the second side plate gradually decreases along a direction away from the bottom plate.

According to the technical solution of the present application, the flange structure and the sealing structure are provided, the flange structure is provided with the flange drainage gap and the sealing structure is provided with the auxiliary drainage gap Water that leaks into the groove first flows along the groove to reach the bottom of the flange structure, after reaching the bottom, the water can be discharged through the flange drainage gap and the auxiliary drainage gap to ensure that water will not enter the interior of the outdoor cabinet. Moreover, water backflow and water leakage can be effectively avoided. Even if the flatness and the surface roughness of the flange structure do not meet the requirements, and there is a clearance between the sealing structure and the flange structure after the sealing structure is sleeved on the flange structure, the water entering the groove can still be discharged through the flange drainage gap and the auxiliary drainage gap. Therefore, the requirements for the flatness and the roughness of the flange structure can be effectively reduced, thereby reducing the processing and manufacturing costs.

BRIEF DESCRIPTION OF THE DRAWINGS

The drawings that constitute a part of the present application are used to provide a further understanding of the present application. The exemplary embodiments of the present application and descriptions thereof are used to illustrate the present application and do not constitute an improper limitation to the present application.

Figure 1:
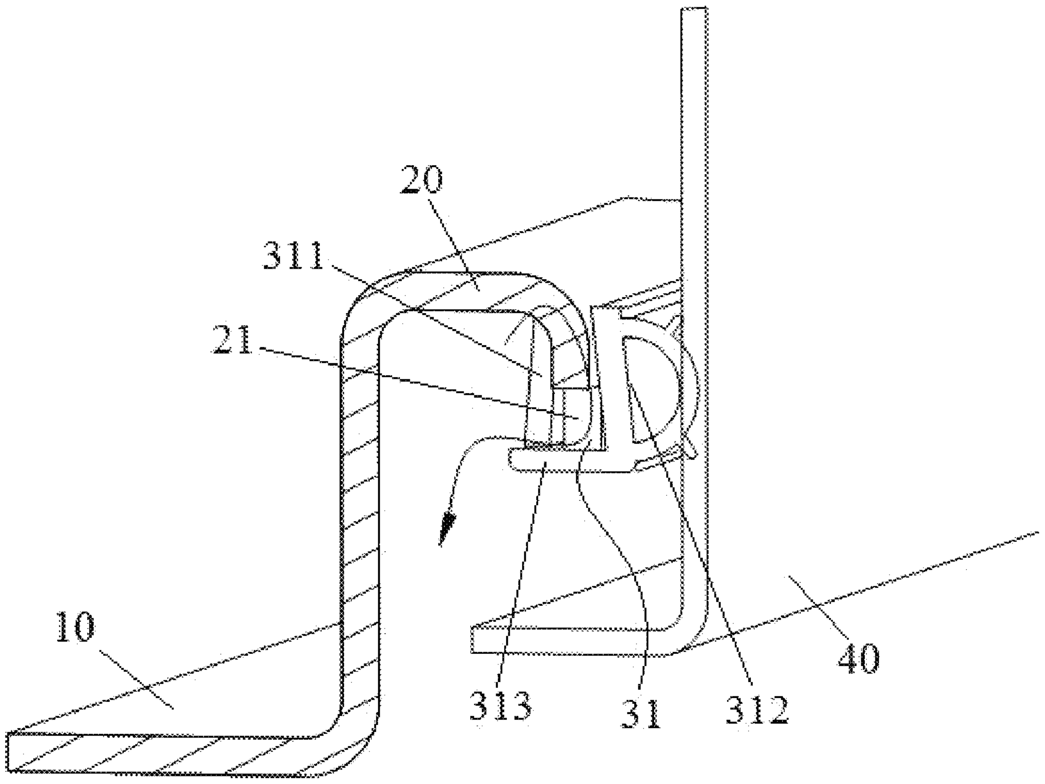
FIG. 1 is a schematic view showing the structure of part of an outdoor cabinet according to an embodiment of the present application.

| Reference numerals: |
|---|
| 10 cabinet body, |
| 20 flange structure, |
| 21 flange drainage gap, |
| 22 transition arc structure, |
| 23 vertical flange, |
| 24 horizontal flange, |
| 30 sealing structure, |
| 31 groove, |
| 32 auxiliary drainage gap, |
| 211 first drainage gap, |
| 212 second drainage gap, |
| 311 first side plate, |
| 312 second side plate, |
| 313 bottom plate, |
| 314 arc section, |
| 321 third drainage gap, |
| 322 fourth drainage gap. |

DETAILED DESCRIPTION OF THE EMBODIMENTS

It should be noted that, when there's no conflict, the embodiments and features thereof in the present application can be combined with one another. The present application is described in detail below with reference to the drawings and the embodiments.

The conventional outdoor cabinet employs a sealing strip to wrap a flange for sealing. In order to ensure the sealing effect of the outdoor cabinet, it is necessary to ensure the roughness of the inside and outside of the flange during processing and manufacturing. However, welding spot and welding slag may inevitably appear at the surface of the flange after welding, and at this time, it is necessary to carefully polish the surface of the flange to ensure the roughness of the surface of the flange. But the space at the inner side of the flange is limited, and the polishing is very difficult. If the flanging is not polished well, the sealing strip may not be tightly clamped in the flange, resulting in water backflow and water leakage from the inside of the sealing strip. In addition, a transitional arc weldment that connects a vertical flange and a horizontal flange is easy to be deformed by a force during welding, so it is necessary to strictly control the welding process to ensure flatness and surface roughness requirements of the arc weldment; otherwise, there is a clearance between the flange and the sealing strip after the sealing strip is clamped, leading to water leakage. In view of the above problems, the manufacturers have spent a lot of manpower and material resources to deal with the machining process, which greatly increases the processing and manufacturing costs.

Figure 2:
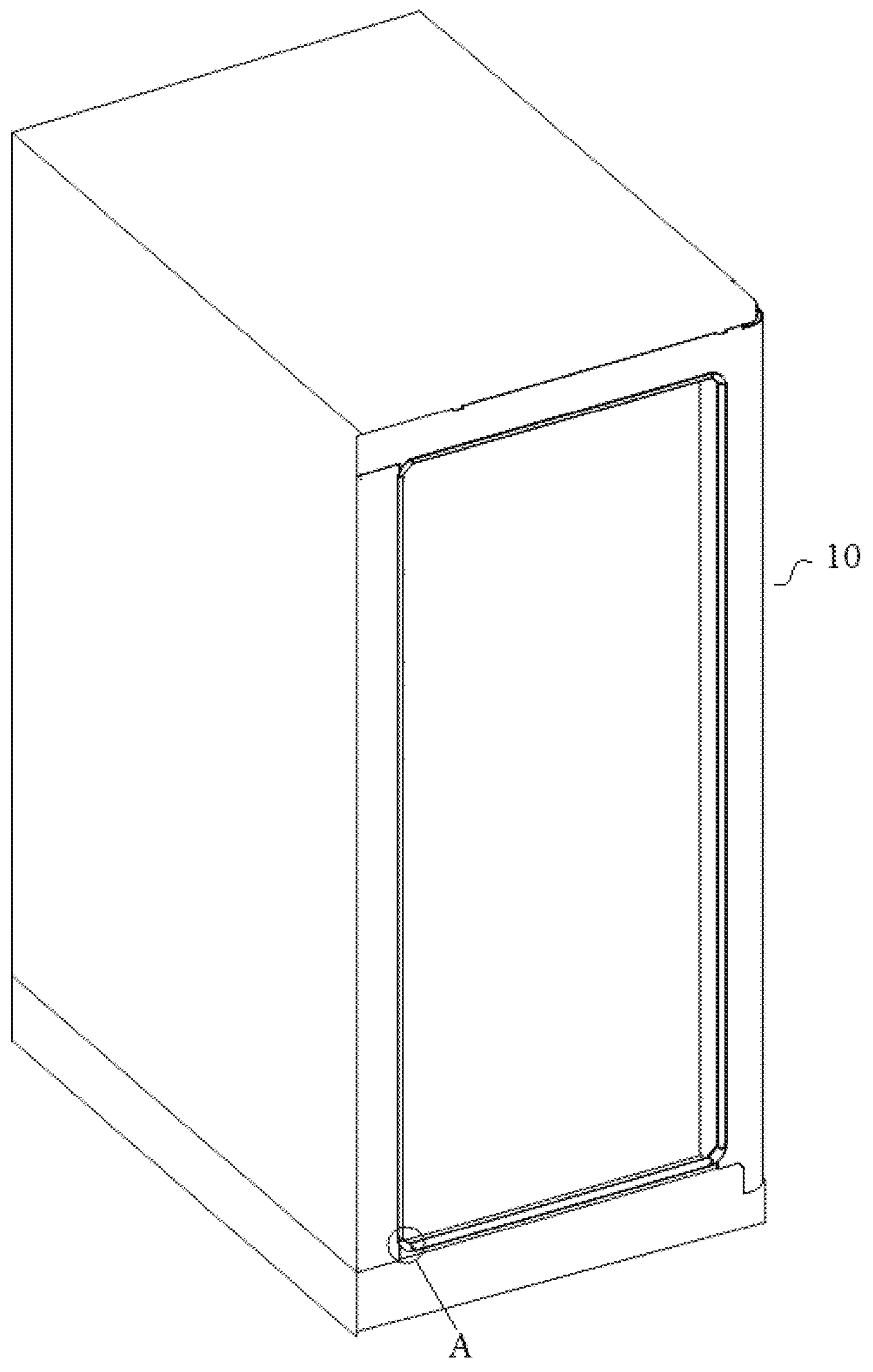
FIG. 2 is a schematic view showing the structure of part of an outdoor cabinet according to an embodiment of the present application.
Figure 3:
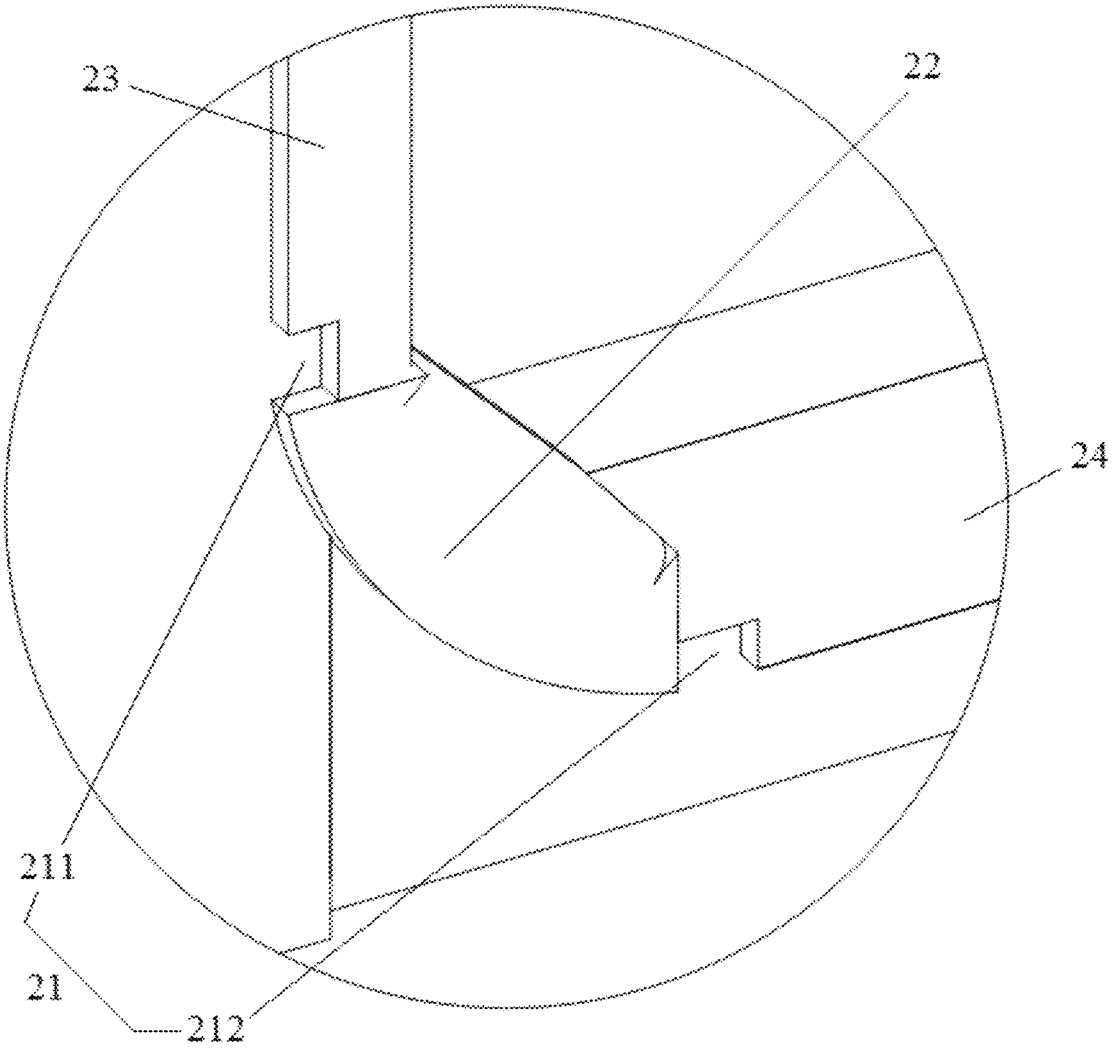
FIG. 3 is an enlarged schematic view showing the structure of a portion A in FIG. 2.
Figure 4:
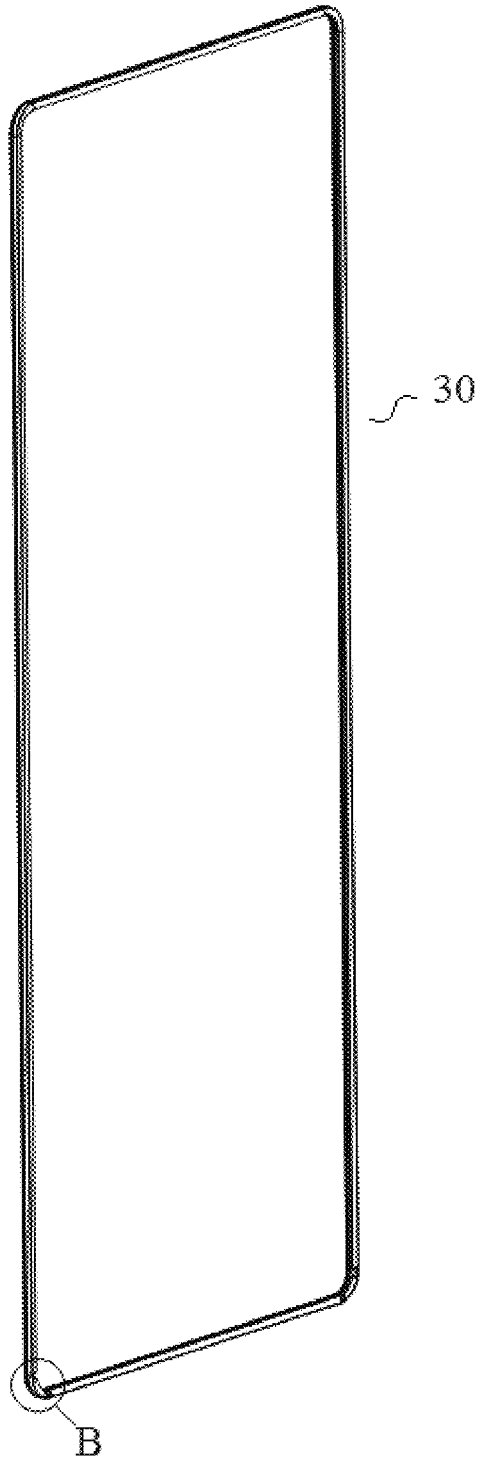
FIG. 4 is a schematic view showing the whole structure of a sealing structure according to an embodiment of the present application.
Figure 5:
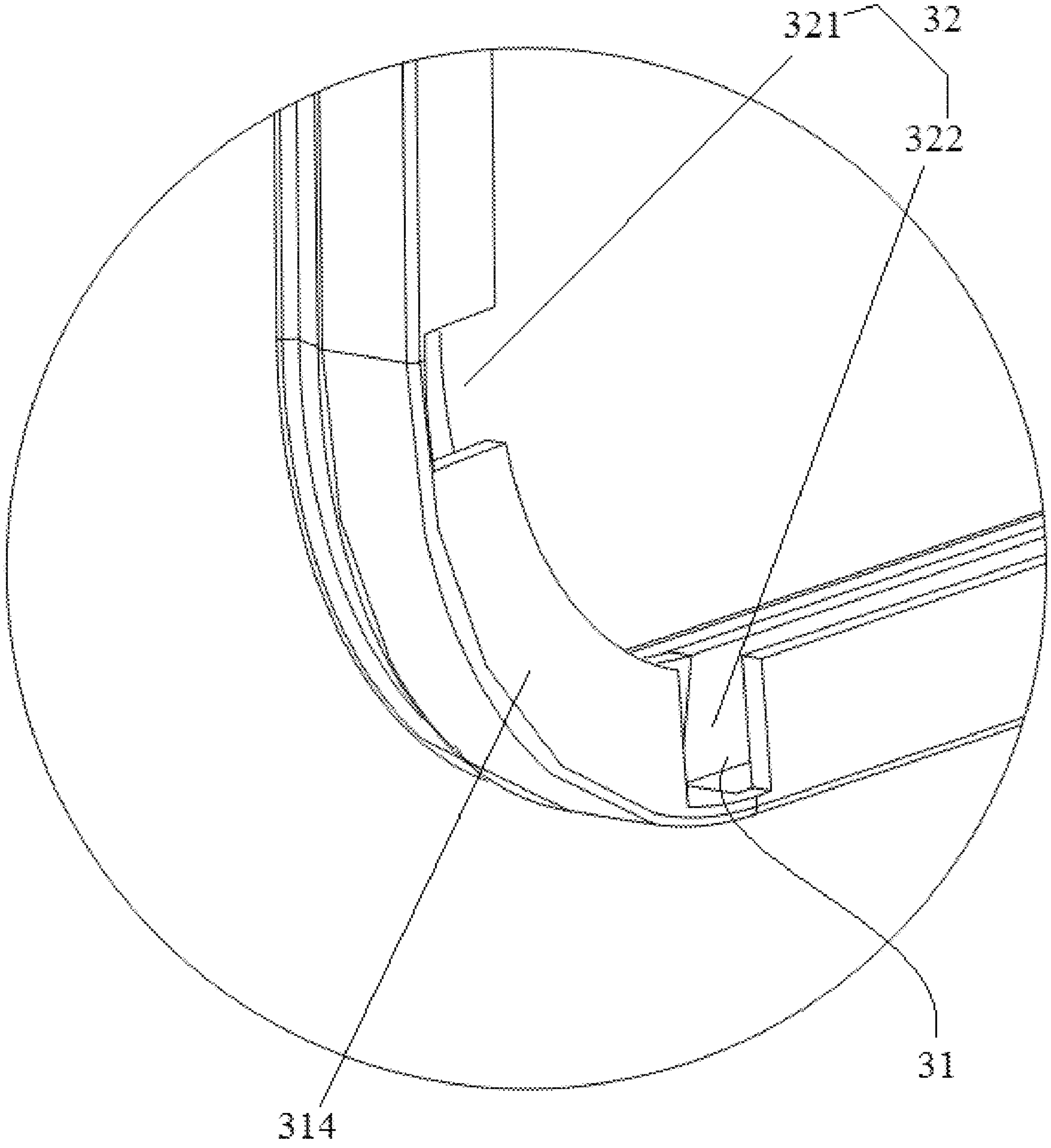
FIG. 5 is an enlarged schematic view showing the structure of a portion B in FIG. 4.

With reference to FIGS. 1 to 5, an outdoor cabinet is provided according to the present application. The outdoor cabinet includes a cabinet body 10, a cabinet door 40, a flange structure 20 and a sealing structure 30. The cabinet door 40 is connected to the cabinet body 10, and the flange structure 20 is arranged on the cabinet body 10. The sealing structure 30 includes a groove 31, and the flange structure 20 is clamped in the groove 31. The flange structure 20 is provided with a flange drainage gap 21, the sealing structure 30 is provided with an auxiliary drainage gap 32, and the flange drainage gap 21 and the auxiliary drainage gap 32 are arranged in positional correspondence with each other. Water entering the groove 31 can be discharged through the flange drainage gap 21 and the auxiliary drainage gap 32. For example, the water may be discharged through the auxiliary drainage gap 32 first and then the flange drainage gap 21.

In the embodiment, the flange drainage gap 21 is provided at a bottom of the flange structure 20, and the sealing structure 30 is sleeved on the flange structure 20. The flange drainage gap 21 of the flange structure 20 positionally corresponds to the auxiliary drainage gap 32 of the sealing structure 30. In rainy days, under the continuous impact of rainwater, some of the rainwater may leak into the groove 31 of the sealing structure 30. The rainwater flows along the flange structure 20 to a bottom of the groove 31. After reaching the bottom, the rainwater can be discharged through the flange drainage gap 21 and auxiliary drainage gap 32. The outflow path of the rainwater is shown as a curve with an arrow in FIG. 1, the rainwater can be discharged timely out of the groove 31, to prevent the water entering the sealing structure 30 from being accumulated in the groove 31 and overflowing out of the sealing structure 30, thereby ensuring that water does not enter the interior of the outdoor cabinet. The above structure is simple and can effectively avoid water backflow and water leakage. Even if the flatness and the surface roughness of the flange structure 20 do not meet the requirements, and there is a clearance between the sealing structure 30 and the flange structure 20 after the sealing structure 30 is sleeved on the flange structure 20, the water entering the groove 31 of the sealing structure 30 can still be discharged in time through the flange drainage gap 21 and the auxiliary drainage gap 32. Therefore, the requirements for the flatness and the roughness of the flange structure 20 can be effectively reduced, thereby reducing the processing and manufacturing costs. The outdoor cabinet in the present application is used outdoors and has protection requirements, for example, the outdoor cabinet is an outdoor electrical cabinet, an outdoor power distribution cabinet or the like.

In the above embodiment, the flange structure 20 is arranged on the cabinet body 10, and the sealing structure 30 is arranged on the cabinet door. It should be noted that alternatively, the flange structure 20 may be arranged on the cabinet door, while the sealing structure 30 being arranged on the cabinet body 10, in this case, when the cabinet door is closed, the flange structure 20 is clamped in the groove 31 to realize sealing of the outdoor cabinet.

In an embodiment of the present application, the sealing structure 30 is a sealing strip.

With reference to FIGS. 1 to 5, in an embodiment of the present application, the sealing structure 30 further includes a groove 31. The groove 31 includes a first side plate 311, a bottom plate 313, and a second side plate 312 that are connected in sequence. The auxiliary drainage gap 32 is formed at the first side plate 311. The second side plate 312 abuts against the flange structure 20 for sealing.

In the embodiment, the first side plate 311 is fitted to a surface of the flange structure 20 close to the cabinet body 10, and the second side plate 312 is fitted to another surface of the flange structure 20 away from the cabinet body 10. The auxiliary drainage gap 32 is formed at the first side plate 311. The rainwater that leaks into the groove 31 flows along the flange structure 20 to the bottom of the groove 31, and after reaching the bottom, the rainwater passes through the flange drainage gap 21 and the auxiliary drainage gap 32 in sequence to be discharged. The second side plate 312 abuts against the flange structure 20 to realize the sealing of the outdoor cabinet.

As shown in FIGS. 1 to 5, in an embodiment of the present application, the number of the flange drainage gap 21 is at least two, and the at least two flange drainage gaps 21 are formed at the bottom of the flange structure 20. At least one of the flange drainage gaps 21 is located on a first side of the flange structure 20, and at least another one of the flange drainage gaps 21 is located on a second side of the flange structure 20.

In the embodiment, the flange drainage gaps 21 are formed at the bottom of the flange structure 20. The first side of the flange structure 20 corresponds to a left side of the cabinet body 10, and the second side of the flange structure 20 corresponds to a right side of the cabinet body 10. At least one flange drainage gap 21 is formed on each of the first side and the second side of the flange structure 20, and a left end and a right end of the bottom of the flange structure 20 are each provided with the flange drainage gap 21. The auxiliary drainage gaps 32 are provided in one-to-one correspondence with the flange drainage gaps 21. In this way, corresponding positions of the sealing structure 30 are provided with the auxiliary drainage gaps 32, the water that leaks into the sealing structure 30 can be discharged through the flange drainage gaps 21 and the auxiliary drainage gaps 32 formed at the left end and the right end of the bottom of the cabinet body 10, thus the drainage is faster and the sealing effect is better.

As shown in FIGS. 1 to 5, in an embodiment of the present application, the flange drainage gap 21 includes a first drainage gap 211 and a second drainage gap 212, the auxiliary drainage gap 32 includes a third drainage gap 321 and a fourth drainage gap 322. The first drainage gap 211 positionally corresponds to the third drainage gap 321, and the second drainage gap 212 positionally corresponds to the fourth drainage gap 322. The first drainage gap 211 is formed at an outer edge of a vertical flange 23, the second drainage gap 212 is formed at a lower edge of the horizontal flange 24, and the first drainage gap 211 is located above the second drainage gap 212. The flange structure 20 includes a transition arc structure 22, the vertical flange 23, and the horizontal flange 24. The vertical flange 23 is connected to the horizontal flange 24 through the transition arc structure 22. The first drainage gap 211 is formed at the vertical flange 23, the second drainage gap 212 is formed at the horizontal flange 24, the first drainage gap 211 is located at a first end of the transition arc structure 22, and the second drainage gap 212 is located at a second end of the transition arc structure 22.

In the embodiment, the first drainage gap 211 is formed at the vertical flange 23, the second drainage gap 212 is formed at the horizontal flange 24, the first drainage gap 211 corresponds to the third drainage gap 321 positionally, the second drainage gap 212 corresponds to the fourth drainage gap 322 positionally, and the vertical flange 23 is connected to the horizontal flange 24 through the transition arc structure 22. Since the first drainage gap 211 is located above the second drainage gap 212, most of the water leaking into the sealing structure 30 from top to bottom first flows out through the first drainage gap 211 and the third drainage gap 321, a small amount of the water that cannot be discharged in time flows along the transition arc structure 22 to the horizontal flange 24, and then flows out through the second drainage gap 212 and the fourth drainage gap 322. With the above arrangement, even if the roughness of the flange structure 20 and the flatness and the roughness of the transition arc structure 22 do not meet the requirements, the water that leaks into the sealing structure 30 can be discharged in time, so that the sealing and waterproof effect of the outdoor cabinet can be ensured, and the manufacturability can be greatly improved.

With reference to FIGS. 1 to 5, in an embodiment of the present application, the third drainage gap 321 is formed at the first side plate 311 or the second side plate 312, and the fourth drainage gap 322 is formed at the first side plate 311 or the second side plate 312.

In the embodiment, the third drainage gap 321 may be formed at the first side plate 311, or may be formed at the second side plate 312, and the fourth drainage gap 322 may be formed at the first side plate 311, or may be formed at the second side plate 312. As the first side plate 311 is fitted to the surface of the flange structure 20 close to the cabinet body 10, and the second side plate 312 is fitted to the surface of the flange structure 20 away from the cabinet body 10, therefore, on the premise that the sealing effect is ensured, the third drainage gap 321 and the fourth drainage gap 322 are preferably formed at the first side plate 311, to prevent the influence on a front appearance of the sealing structure 30.

With reference to FIGS. 1 to 5, in an embodiment of the present application, the groove 31 includes an arc section 314. The arc section 314 is located at the bottom of the sealing structure 30, and the arc section 314 can match the transition arc structure 22.

In the embodiment, the groove 31 of the sealing structure 30 includes the arc section 314 and can match the transition arc structure 22. With the above arrangement, it can be ensured that the sealing structure 30 is sleeved on the flange structure 20 more closely, to ensure the sealing effect.

With reference to FIGS. 1 to 5, in an embodiment of the present application, an area of the auxiliary drainage gap 32 is greater than an area of the flange drainage gap 21.

With the above arrangement, the water that leaks into the interior of the sealing structure 30 can be discharged more easily.

With reference to FIGS. 1 to 5, in an embodiment of the present application, the groove 31 is a U-shaped groove 31, and a distance between the first side plate 311 and the second side plate 312 gradually decreases along a direction away from the bottom plate 313.

With the above arrangement, it can be ensured that after the sealing structure 30 is sleeved on the flange structure 20, the sealing structure 30 is not prone to fall off or play relative to the flange structure 20, and thus has better structural stability.

From the above description, it can be seen that the embodiments of the present application achieve the following technical effects: the flange structure and the sealing structure are provided, the flange structure is provided with the flange drainage gap, and the sealing structure is provided with the auxiliary drainage gap. The water that leaks into the groove first flows along the groove to the bottom of the flange structure, after reaching the bottom, the water can be discharged through the flange drainage gap and the auxiliary drainage gap, to ensure that no water enters the interior of the outdoor cabinet, and water backflow and water leakage can be effectively avoided. Even if the flatness and the surface roughness of the flange structure do not meet the requirements, and there is a clearance between the sealing structure and the flange structure after the sealing structure is sleeved on the flange structure, the water entering the groove can still be discharged through the flange drainage gap and the auxiliary drainage gap. Therefore, the requirements for the flatness and the roughness of the flange structure can be effectively reduced, and thus the processing and manufacturing costs can be reduced.

Apparently, the described embodiments are only part of the embodiments of the present application, rather than all of the embodiments. Any other embodiments obtained by those skilled in the art based on the embodiments in the present application without creative efforts shall fall within the protection scope of the present application.

It should be noted that, the terms used herein are only for describing the specific embodiments, rather than intending to limit the exemplary embodiments according to the present application. As used herein, a singular form is also intended to include a plural form unless the context explicitly indicates otherwise. In addition, it should be understood that when the terms the terms "comprises" and/or "includes" are used in this specification, it is indicated that there are a feature, a step, an operation, a device, a component, and/or a combination thereof.

The above is only preferred embodiments of the present application and is not intended to limit the present application. For those skilled in the art, various modifications and changes may be made to the present application. Any modifications, equivalent replacements, improvements, and the like made within the principle of the present application shall be included within the protection scope of the present application.

The invention claimed is:

1. An outdoor cabinet, comprising:

a cabinet body;

a cabinet door being connected to the cabinet body;

a flange structure; and a sealing structure having a groove, wherein the flange structure is provided on the cabinet body;

the sealing structure comprises a first side plate, a bottom plate and a second side plate that are connected in sequence to define the groove, and the flange structure is clamped in the groove; and a flange drainage notch is provided on the flange structure, an auxiliary drainage notch is provided on the sealing structure, the flange drainage notch and the auxiliary drainage notch are aligned with each other, and are configured to discharge water entering the groove.

2. The outdoor cabinet according to claim 1, wherein the the auxiliary drainage notch is provided on the first side plate, and the second side plate abuts against the flange structure for sealing.

3. The outdoor cabinet according to claim 1, wherein the number of flange drainage notches is at least two, the at least two flange drainage notches are provided on a bottom of the flange structure, wherein at least one of the at least two flange drainage notches is located on a first side of the flange structure, and at least another one of the at least two flange drainage notches is located on a second side of the flange structure.

4. The outdoor cabinet according to claim 2, wherein the flange drainage notch comprises a first drainage notch and a second drainage notch, the auxiliary drainage notch comprises a third drainage notch and a fourth drainage notch, wherein the first drainage notch and the third drainage notch are arranged in positional correspondence with each other, and the second drainage notch and the fourth drainage notch are arranged in positional correspondence with each other.

5. The outdoor cabinet according to claim 4, wherein the flange structure comprises a transition arc structure, a vertical flange, and a horizontal flange, wherein the vertical flange is connected to the horizontal flange through the transition arc structure, the first drainage notch is formed on the vertical flange, the second drainage notch is formed on the horizontal flange, and the first drainage notch is located above the second drainage notch.

6. The outdoor cabinet according to claim 4, wherein the third drainage notch is formed on the first side plate or the second side plate, and the fourth drainage notch is formed on the first side plate or the second side plate.

7. The outdoor cabinet according to claim 5, wherein the first drainage notch is located on a first end of the transition arc structure, and the second drainage notch is located on a second end of the transition arc structure.

8. The outdoor cabinet according to claim 5, wherein the groove comprises an arc section, the arc section is located at a bottom of the sealing structure, and the arc section is configured to match the transition arc structure.

9. The outdoor cabinet according to claim 4, wherein an area of the auxiliary drainage notch is greater than an area of the flange drainage notch.

10. The outdoor cabinet according to claim 2, wherein the groove is a U-shaped groove, and a distance between the first side plate and the second side plate gradually decreases along a direction away from the bottom plate.

11. The outdoor cabinet according to claim 1, wherein an area of the auxiliary drainage notch is greater than an area of the flange drainage notch.

12. The outdoor cabinet according to claim 2, wherein an area of the auxiliary drainage notch is greater than an area of the flange drainage notch.

13. The outdoor cabinet according to claim 5, wherein an area of the auxiliary drainage notch is greater than an area of the flange drainage notch.

14. The outdoor cabinet according to claim 6, wherein an area of the auxiliary drainage notch is greater than an area of the flange drainage notch.

15. The outdoor cabinet according to claim 7, wherein an area of the auxiliary drainage notch is greater than an area of the flange drainage notch.

16. The outdoor cabinet according to claim 8, wherein an area of the auxiliary drainage notch is greater than an area of the flange drainage notch.

* * * * *